(12) United States Patent
Sezi

(10) Patent No.: US 7,070,904 B2
(45) Date of Patent: *Jul. 4, 2006

(54) POLYBENZOXAZOLES FROM POLY-O-HYDROXYAMIDE, NOVEL POLY-O-HYDROXYAMIDES, PREPARATION PROCESSES THEREFOR, AND THEIR APPLICATION IN MICROELECTRONICS

(75) Inventor: Recai Sezi, Roettenbach (DE)

(73) Assignee: Infineon Technologies AG, Munich (DE)

( * ) Notice: Subject to any disclaimer, the term of this patent is extended or adjusted under 35 U.S.C. 154(b) by 282 days.

This patent is subject to a terminal disclaimer.

(21) Appl. No.: 10/244,802

(22) Filed: Sep. 16, 2002

(65) Prior Publication Data

US 2003/0134226 A1    Jul. 17, 2003

(30) Foreign Application Priority Data

Sep. 14, 2001    (DE) ................... 101 45 469

(51) Int. Cl.
*G03F 7/004*    (2006.01)

(52) U.S. Cl. .................. 430/270.1; 430/283.1; 558/272

(58) Field of Classification Search ............ 430/270.1, 430/311, 283.1; 558/272
See application file for complete search history.

(56) References Cited

U.S. PATENT DOCUMENTS

| | | | | |
|---|---|---|---|---|
| 4,339,521 A * | 7/1982 | Ahne et al. | ........... | 430/192 |
| 4,622,285 A * | 11/1986 | Ahne | ........... | 430/322 |
| 4,849,051 A * | 7/1989 | Ahne et al. | ........... | 216/48 |
| 5,021,320 A * | 6/1991 | Mueller et al. | ........... | 430/192 |
| 5,037,720 A * | 8/1991 | Khanna | ........... | 430/190 |
| 5,077,378 A | 12/1991 | Mueller et al. | | |
| 5,096,999 A * | 3/1992 | Hellmut et al. | ........... | 528/182 |
| 5,106,720 A | 4/1992 | Mueller et al. | | |
| 5,240,819 A | 8/1993 | Mueller et al. | | |
| 5,922,825 A * | 7/1999 | Sezi et al. | ........... | 528/191 |
| 5,973,202 A * | 10/1999 | Sezi et al. | ........... | 564/134 |
| 6,437,178 B1 * | 8/2002 | Sezi et al. | ........... | 562/433 |
| 6,866,980 B1 * | 3/2005 | Sezi | ........... | 430/270.1 |

FOREIGN PATENT DOCUMENTS

| | | |
|---|---|---|
| EP | 0 264 678 A1 | 4/1988 |
| EP | 0 264 678 B1 | 4/1988 |
| EP | 0 378 156 A2 | 7/1990 |
| EP | 1375559 A1 * | 1/2004 |
| JP | 10204291 A * | 8/1998 |
| JP | 11 202 489 A | 7/1999 |
| JP | 11202489 A * | 7/1999 |
| JP | 2001049119 A * | 2/2001 |

OTHER PUBLICATIONS

English language abstract of JP 11-202489.*
English language abstract of JP 2001-049119.*
English language abstract of 10-204291.*
Hong et al, "Chemically Amplified Photosensitive Polybenzoxazoles Based on tert-Butoxycarbonyl Protected Hyperbranched Poly (o-hydroxyamide)s" Macromolecules, 2003, 36, 3174-3179.*

* cited by examiner

*Primary Examiner*—Amanda Walke
(74) *Attorney, Agent, or Firm*—Laurence A. Greenberg; Werner H. Stemer; Ralph E. Locher

(57) ABSTRACT

High-temperature-stable polybenzoxazoles are formed from novel poly-o-hydroxyamides. The novel poly-o-hydroxyamides have low dielectric constants, are suitable for exposure at 248 nm or shorter wavelengths, and have hydroxyl groups at least some of which have been protected by tert-butoxycarbonyl protective groups.

18 Claims, No Drawings

POLYBENZOXAZOLES FROM POLY-O-HYDROXYAMIDE, NOVEL POLY-O-HYDROXYAMIDES, PREPARATION PROCESSES THEREFOR, AND THEIR APPLICATION IN MICROELECTRONICS

BACKGROUND OF THE INVENTION

Field of the Invention

The invention relates to novel poly-o-hydroxyamides, to the high-temperature-stable polybenzoxazoles obtainable from them, to processes for preparing these compounds and to a photosensitive formulation.

In microelectronics, polybenzoxazoles with high temperature stability are used, for example, as dielectrics and buffer coatings. The precursors of these polybenzoxazoles, known as poly-o-hydroxyamides, can also be made photoreactive if suitable photoactive components are mixed into the formulation of these dielectrics. By heat treatment (baking) at temperatures above 250° C., the precursor is converted into polybenzoxazole.

The mechanism which takes place during the cyclization of poly-o-hydroxyamides to polybenzoxazoles is depicted schematically below:

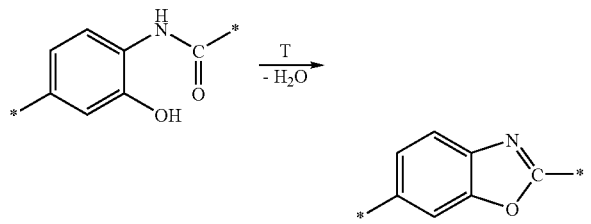

On heating, the o-hydroxyamide cyclizes with elimination of water to give the oxazole.

In addition to the thermal and mechanical stability, the dielectric constant of these materials is an important criterion for their application. It must be as small as possible in order that the electrical insulation effect, e.g., between conductor tracks or conductor track planes, is good and the electrical performance of the microelectronic component is enhanced.

Photostructurable poly-o-hydroxyamides have the advantage over the prior art polyimides that they are positively structurable (relatively low defect susceptibility, since in the majority of cases only a small part of the layer need be exposed), are developed in aqueous alkali (polyamides usually with organic solvents), and exhibit a higher chemical and thermal resistance. Moreover, they generally have a lower dielectric constant than polyimides (following conversion to the polybenzoxazole).

In order to obtain a high resolution, i.e., small structures, an exposure apparatus is used which operates at short wavelengths, at 248 nm or less for example. The majority of buffer coatings used, however, absorb even at this wavelength to such a great extent that sufficient exposure of the added photoactive component down into the lower regions of the coating is barely still possible. This problem can be solved by raising the transparency of the coating, in the first place that of the base polymer of this coating.

European patent EP 264678 B1 and its counterpart U.S. Pat. Nos. 5,106,720; 5,240,819; and 5,077,378 presents poly-o-hydroxyamides which, however, have the advantage that they have relatively high dielectric constants and absorb strongly at wavelengths of 248 nm and below.

SUMMARY OF THE INVENTION

It is accordingly an object of the invention to provide novel poly-o-hydroxyamides that overcome the above-mentioned disadvantages of the heretofore-known devices and methods of this general type and wherein the poly-o-hydroxyamides have low dielectric constants, preferably a dielectric constant of less than 3.0, and absorb only weakly in the wavelength range of 248 nm and below.

With the foregoing and other objects in view there is provided, in accordance with the invention, a poly-o-hydroxyamide complex, comprising:

poly-o-hydroxyamide having at least some hydroxyl groups protected by tert-butoxycarbonyl groups, the tert-butoxycarbonyl groups having the formula

formula I wherein the radicals $R^3$, $R^4$, and $R^5$ are selected from the group consisting of —H, —F, —$(CH_2)_n$—$CH_3$, —$(CF_2)_n$—$CF_3$, where n=0 to 10, and with a proviso that at least one of the radicals $R^3$, $R^4$, and $R^5$ is different from hydrogen.

In other words, the present invention achieves the object by providing poly-o-hydroxyamides where at least some of the hydroxyl groups have been protected by tert-butoxycarbonyl groups (t-BOC) of the formula I.

Particular preference is given to using tert-butoxycarbonyl groups in which the radicals $R^3$, $R^4$, and $R^5$ are formed by —$(CH_2)_n$—$CH_3$, especially —$CH_3$.

The proportion of the hydroxyl groups blocked by a t-BOC group of the formula I relative to the number of free hydroxyl groups in the unprotected poly-o-hydroxyamide is preferably at least 30%, in particular at least 50%.

By poly-o-hydroxyamides are meant polymers which are obtained by condensing bis-o-aminophenols with dicarboxylic acids, which may where appropriate have been activated. The terminal groups of the polymer can be blocked by appropriate monovalent groups. By bis-o-aminophenols are meant compounds which have two pairs of hydroxyl and amino groups positioned ortho to one another and attached to phenyl rings, it being possible for the pairs formed in each case from a hydroxyl group and an amino group to be sited on different phenyl rings or on the same phenyl ring.

Particularly preferred poly-o-hydroxyamides correspond to the general formula II:

formula II

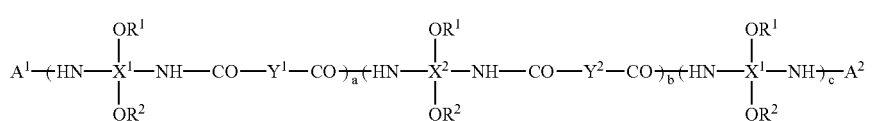

in which $R^1$ and $R^2$ are identical or different and are hydrogen or a tert-butoxycarbonyl group of the general formula I, at least one of $R^1$ or $R^2$ being formed at least in part by —COOC($R^3R^4R^5$);

$A^1$ and $A^2$ (attached to —NH—) are identical or different and are selected from the group consisting of the following elements: —H; —CO—$(CH_2)_n$—$CH_3$; —CO—$(CF_2)_n$—$CF_3$; —CO—CH=CH—COOH; where n=0 to 10;

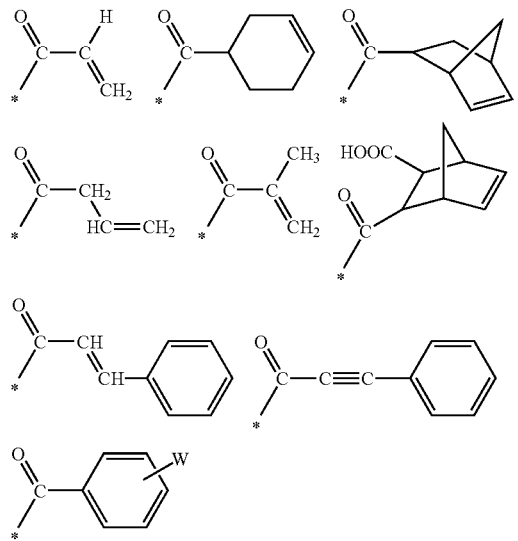

where W=—H, —F, —CN, —C$(CH_3)_3$, —$(CH_2)_n$—$CH_3$, —$(CF_2)_n$—$CF_3$, —O—$(CH_2)_n$—$CH_3$, —O—$(CF_2)_n$—$CF_3$; —CH=$CH_2$, —C≡CH or

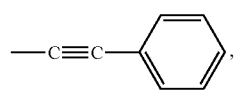

where n=0 to 10;

where if $A^2$ is attached to —CO— and/or c=0, $A^2$ is an OH group;

$X^1$ and $X^2$, independently of one another, are:

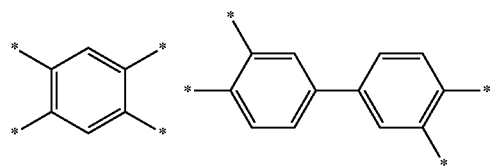

-continued

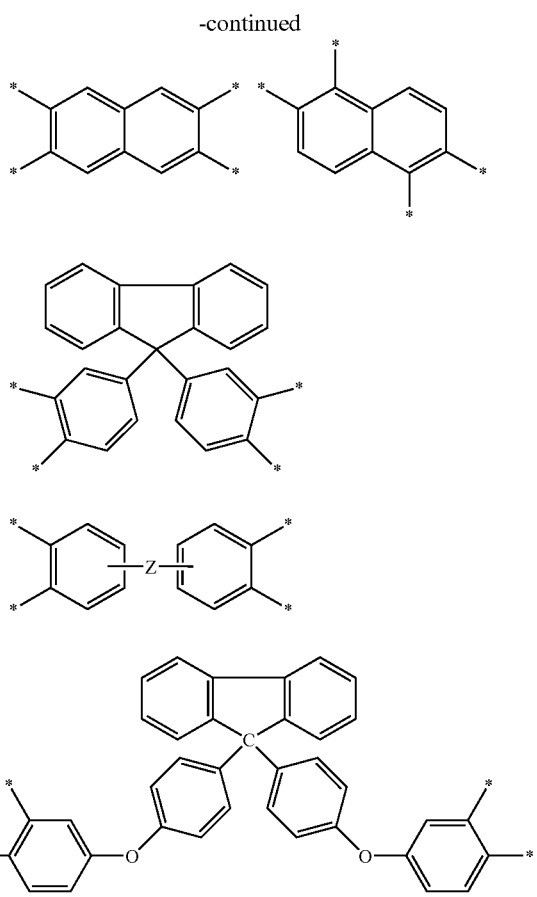

Z is selected from the group consisting of the following elements: —O—; —CO—; —S—; —S—S—; —$SO_2$—; —$(CH_2)_m$—; —$(CF_2)_m$— where m=1 to 10; —C $(CR^6_3)_2$— where $R^6$ is identical or different and can be a hydrocarbon radical which has 1 to 2 carbon atoms and may also be fully or partly fluorinated, hydrogen, halide or pseudohalide;

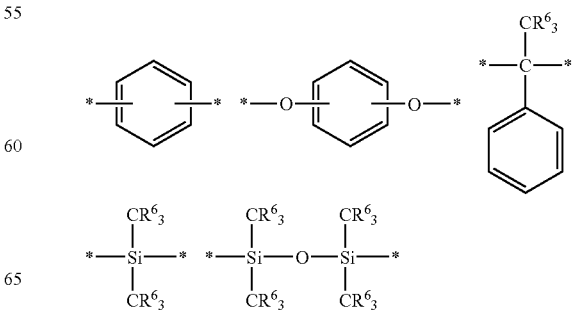

-continued

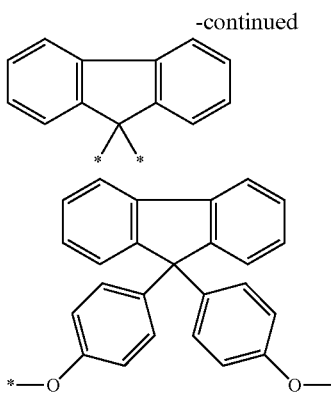

$Y^1$ and $Y^2$, independently of one another, are:

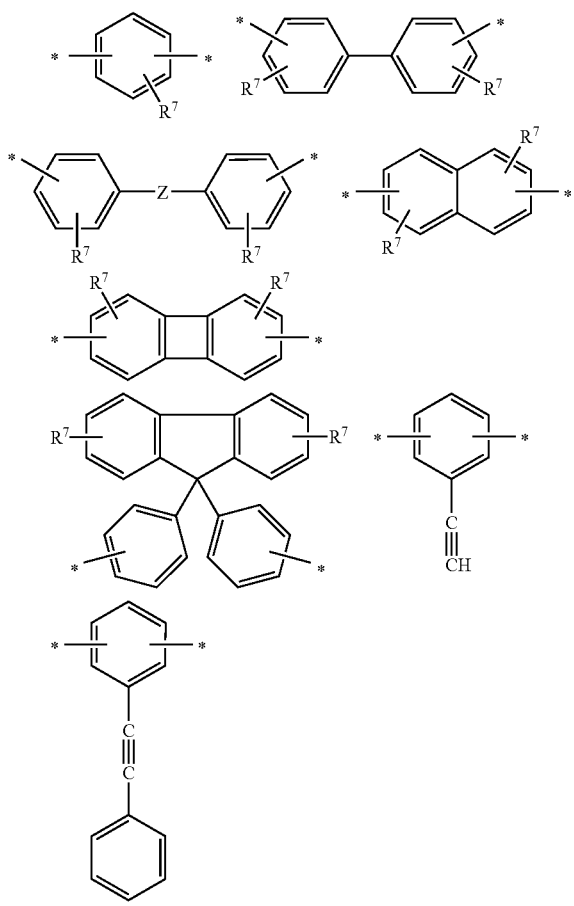

in which $R^7$ can be:
—H, —CN; —C(CH$_3$)$_3$; —C(CF$_3$)$_3$; —(CH$_2$)$_n$—CH$_3$; —(CF$_2$)$_n$—CF$_3$; —O—(CH$_2$)$_n$—CH$_3$, —O—(CF$_2$)$_2$—CF$_3$; —C≡CH; —CH=CH$_2$; —O—CH=CH$_2$; —O—CH$_2$—=CH$_2$; —CO—(CH$_2$)$_n$—CH$_3$; —CO—(CF$_2$)$_n$—CF$_3$, where n=0 to 10;

and Z is as defined above;

finally, a may adopt any value from 1 to 100; b may adopt any value from 0 to 100, and c may adopt the value 0 or 1.

The poly-o-hydroxyamides may be prepared by reacting the corresponding t-BOC-protected bisaminophenols with activated dicarboxylic acids, e.g., dicarbonyl dichlorides, where appropriate in a suitable solvent. It will be appreciated that in the synthesis not all polymer molecules will have a uniform molecular weight but that a molecular weight distribution will be obtained. The synthesis is conducted such that the maximum of the molecular weight distribution lies in the range defined by the above-indicated values of the indices a, b, and c. The molecular weight distribution can be determined by customary techniques, examples being gel-chromatographic techniques.

According to one embodiment of the preparation process, the protected bis-o-aminophenol and the acid chloride are reacted in an organic solvent and the poly-o-hydroxyamide is precipitated by dropwise addition of the reaction solution to a suitable precipitant.

According to another embodiment of the process for preparation, the t-BOC-protected bis-o-aminophenol and the acid chloride are reacted in an organic solvent, the end groups being blocked, for example, with a monoacid chloride or a dicarboxylic anhydride. This process is also referred to as endcapping.

Finally, according to a further embodiment of the process, a poly-o-hydroxyamide whose hydroxyl groups are unprotected is reacted with di-tert-butyl dicarbonate in a suitable solvent, where appropriate in the presence of a catalyst.

Also suitable besides acid chlorides are what are known as active esters of the (di)carboxylic acids for preparing the poly-o-hydroxyamides, examples being esters with hydroxybenzotriazole or hydroxysuccinimide.

The reaction may take place at temperatures from −20° C. to 100° C. The boiling temperature of the solvent is critical in particular.

Where acid chlorides are used during the polymerization, it is advantageous to use a basic acid scavenger. Basic acid scavengers used are preferably pyridine, triethylamine, diazabicyclooctane or polyvinylpyridine. In principle, however, it is also possible to use other basic acid scavengers. Particular preference is given to those which are readily soluble in the solvent used for the synthesis, e.g., NMP, and in water or water/alcohol mixtures (precipitants), or those which are completely insoluble in the solvent (e.g., crosslinked polyvinylpyridine).

Particularly suitable solvents for the polymer synthesis are γ-butyrolactone, N-methylpyrrolidone, tetra-hydro-furan, dioxane, acetone, butanone, cyclo-hexanone, cyclopentanone, methoxypropyl acetate, dimethyl sulfoxide, and dimethylacetamide. In principle, however, it is possible to use any solvent in which the starting components are readily soluble and with which the acid chlorides do not themselves react (such as alcohols, for example). Particularly suitable precipitants are water and/or mixtures of water with different alcohols (e.g., isopropanol, ethanol).

Suitable catalysts include bases, the base possibly being, for example, sodium hydroxide or potassium hydroxide, an amine or a basic salt. Suitable amines include, for example, triethylamine, diethylamine, ethylamine, diazabicyclooctane, dimethylbenzylamine, dimethylaminobenzene, tetramethylammonium hydroxide, etc. In principle, all amines soluble in the reaction medium are suitable. Particularly suitable basic salts are alkoxides of the alkali metals and alkaline earth metals, e.g., sodium methoxide or potassium tert-butoxide.

Cyclization to the benzoxazole takes place by heating of the poly-o-hydroxyamide, which is usually in the form of a film, which may where appropriate have been structured. Cyclization can take place directly, i.e., without elimination of the tert-butoxycarbonyl groups of the formula I beforehand, at relatively high temperatures. Cyclization may also be conducted at lower temperatures in the range from about 80 to 120° C. if the tert-butoxycarbonyl groups of the formula I have been eliminated beforehand, by acid for example.

The invention is illustrated below with reference to selected examples which depict embodiments of the invention, and with reference to a comparative example:

In the examples, the poly-o-hydroxyamides with tert-butoxycarbonyl (t-BOC) protective groups were prepared either from the corresponding starting monomers or else by a polymer-analogous reaction; poly-o-hydroxyamides without t-BOC groups are reacted with di-tert-butyl dicarbonate and hence the hydroxyl groups of the polymer are fully or partly blocked.

The reactions are conducted in a dry atmosphere under nitrogen.

The dicarbonyl dichlorides used in the examples are:

isophthaloyl dichloride:

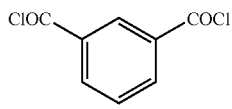

diphenyl ether 4,4'-dicarbonyl dichloride:

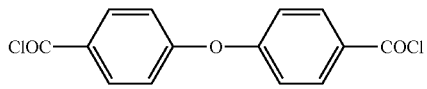

2,2'bis(4,4'-chlorocarboxyphenyl)hexafluoropropane:

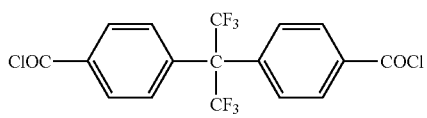

and 4,4'-chlorocarboxybiphenyl:

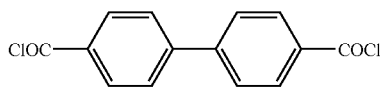

DESCRIPTION OF THE PREFERRED EMBODIMENTS

EXAMPLE 1 a) Preparation of t-BOC-protected Poly-o-hydroxyamide with t-BOC bisaminophenol 1

This polymer is prepared using a t-BOC-protected bisaminophenol (t-BOC bisaminophenol 1) of the following formula:

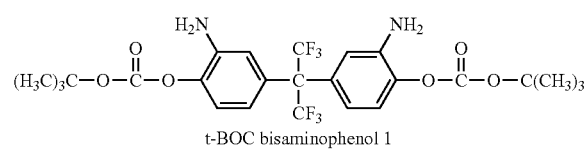

t-BOC bisaminophenol 1

28.3 g (0.05 mol) of t-BOC bisaminophenol 1 are dissolved in 250 ml of distilled N-methylpyrrolidone (NMP). Added dropwise to this solution at 10° C. with stirring is a solution of 8.1 g (0.04 mol) of isophthaloyl dichloride in 80 ml of γ-butyrolactone and the reaction solution is stirred at room temperature for 16 hours. Thereafter this solution is admixed dropwise with 3.1 g (0.02 mol) of norbornenecarbonyl chloride in 30 ml of γ-butyrolactone, in order to block the end groups, followed by stirring for 3 hours more. Subsequently 9.5 g (0.12 mol) of pyridine in solution in 50 ml of γ-butyrolactone are slowly added dropwise to the reaction solution at room temperature and the reaction solution is stirred at room temperature for a further 2 hours. The resulting polymer is precipitated by adding the reaction solution dropwise to a mixture of isopropanol and water (3:1) and the precipitate is washed three times with fresh precipitant and dried in a vacuum oven at 50° C./10 mbar for 72 hours.

The t-BOC polyhydroxyamide (polyhydroxyamide whose hydroxyl groups have been protected with t-BOC) prepared in this way is readily soluble in solvents such as NMP, γ-butyrolactone, acetone, tetrahydrofuran, cyclopentanone, diethylene glycol monoethyl ether, and ethyl lactate.

Thermogravimetric analysis (TGA) shows that all of the hydroxyl groups of the poly-o-hydroxyamide have been protected by t-BOC groups.

b) Formulation, Film Formation, Heat Treatment, and Determination of the Dielectric Constant 3 g of the poly-o-hydroxyamide obtained under (a) are dissolved in 9 g of cyclopentanone and the solution is subjected to pressure filtration. The substrate used for the following experiment is a silicon wafer sputter-coated with titanium nitride. The formulation obtained in the above way is applied to the substrate and spun for 20 seconds in a centrifuge. For the drying of the layer, the substrate is subsequently placed on a hot plate at 100° C. for 1 minute. After drying, the layer is heat-treated (baked) in order to convert the polymer into polybenzoxazole. For this purpose the coated substrate is placed in a regulatable oven and the oven is heated to 350° C. (heating rate 3° C./min under nitrogen). After one hour at 350° C., the oven is switched off and, after it is cooled, the coated substrate is withdrawn again.

The dielectric constant of the above polymer film, determined by the capacitive method, is 2.6.

EXAMPLE 2 a) Preparation of t-BOC-Protected Poly-o-hydroxyamide with t-BOC Bisaminophenol 2

This polymer is prepared using a t-BOC-protected bisaminophenol (t-BOC bisaminophenol 2) of the following formula:

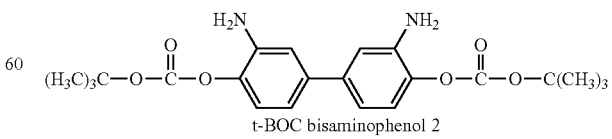

t-BOC bisaminophenol 2

20.8 g (0.05 mol) of t-BOC bisaminophenol 2 are dissolved in 250 ml of distilled N-methylpyrrolidone (NMP). Added dropwise to this solution at 10° C. with stirring is a solution of 11.8 g (0.04 mol) of diphenyl ether 4,4-dicarbonyl dichloride in 80 ml of γ-butyrolactone and the reaction solution is stirred at room temperature for 16 hours. Thereafter this solution is admixed dropwise with 2.1 g (0.02 mol) of methacryloyl chloride in 30 ml of γ-butyrolactone, in order to block the end groups, followed by stirring for 3 hours more. Subsequently 9.5 g (0.12 mol) of pyridine in solution in 50 ml of γ-butyrolactone are slowly added dropwise to the reaction solution at room temperature and the reaction solution is stirred at room temperature for a further 2 hours. The resulting polymer is precipitated by adding the reaction solution dropwise to a mixture of isopropanol and water (3:1) and the precipitate is washed three times with fresh precipitant and dried in a vacuum oven at 50° C./10 mbar for 72 hours.

The t-BOC polyhydroxyamide prepared in this way is readily soluble in solvents such as NMP, γ-butyrolactone, acetone, tetrahydrofuran, cyclo-pentanone, diethylene glycol monoethyl ether, and ethyl lactate.

Thermogravimetric analysis (TGA) shows that all of the hydroxyl groups of the poly-o-hydroxyamide have been protected by t-BOC groups.

EXAMPLE 3 a) Preparation of t-BOC-protected Poly-o-hydroxyamide (Copolymer) with t-BOC bisaminophenol 3 and t-BOC bisaminophenol 4

This polymer is prepared using two different t-BOC-protected bisaminophenols (t-BOC bisaminophenols 3 and 4). The end groups are not blocked.

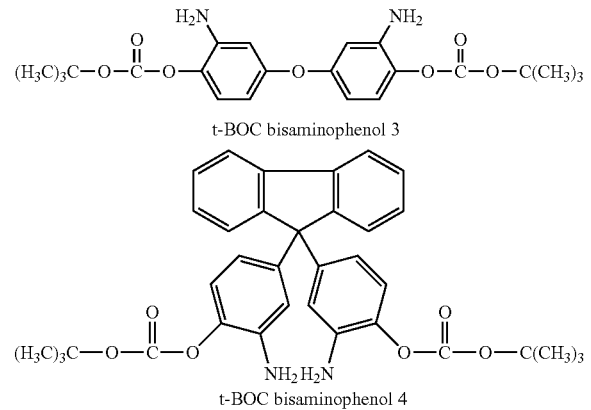

t-BOC bisaminophenol 3 t-BOC bisaminophenol 4

8.7 g (0.02 mol) of t-BOC bisaminophenol 3 and 11.6 g (0.02 mol) of t-BOC bisaminophenol 4 are dissolved in 250 ml of distilled N-methylpyrrolidone (NMP). Added dropwise to this solution at 10° C. with stirring is a solution of 8.6 g (0.02 mol) of 2,2'-bis(4,4'-chloro-carboxyphenyl) hexafluoropropane and 5.6 g (0.02 mol) of 4,4'-chlorocarboxybiphenyl in 100 ml of γ-butyrolactone and the reaction solution is stirred at room temperature for 16 hours. Subsequently 7.9 g (0.1 mol) of pyridine in solution in 50 ml of γ-butyrolactone are slowly added dropwise to the reaction solution at room temperature and the reaction solution is stirred at room temperature for a further 2 hours. The resulting polymer is precipitated by adding the reaction solution dropwise to a mixture of isopropanol and water (3:1) and the precipitate is washed three times with fresh precipitant and dried in a vacuum oven at 50° C./10 mbar for 72 hours.

The t-BOC polyhydroxyamide (polyhydroxyamide whose hydroxyl groups have been protected with t-BOC) prepared in this way is readily soluble in solvents such as NMP, γ-butyrolactone, acetone, tetrahydrofuran, cyclopentanone, diethylene glycol monoethyl ether, and ethyl lactate.

Thermogravimetric analysis (TGA) shows that all of the hydroxyl groups of the poly-o-hydroxyamide have been protected by t-BOC groups.

EXAMPLE 4

In the following examples an unprotected poly-o-hydroxyamide is protected by reacting the polymer with di-tert-butyl dicarbonate.

Bisaminophenol I:

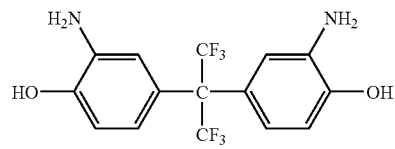

Bisaminophenol II:

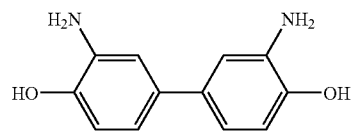

a) Preparation of the Unprotected Polyhydroxyamide (Copolymer)

9.2 g (0.025 mol) of bisaminophenol I are dissolved together with 5.4 g (0.025 mol) of bisaminophenol II in 250 ml of distilled N-methylpyrrolidone (NMP). Added dropwise to this solution at 10° C. with stirring is a solution of 8.1 g (0.04 mol) of isophthaloyl dichloride in 80 ml of γ-butyrolactone and the reaction solution is stirred at room temperature for 16 hours. This solution is then admixed dropwise with 2.0 g (0.02 mol) of maleic anhydride and 30 ml of γ-butyrolactone, in order to block the end groups, followed by stirring for 3 hours more. Subsequently 9.5 g (0.12 mol) of pyridine in solution in 50 ml of γ-butyrolactone are slowly added dropwise to the reaction solution at room temperature and the reaction solution is stirred at room temperature for a further 2 hours. The resulting polymer is precipitated by adding the reaction solution dropwise to a mixture of isopropanol and water (3:1), and the precipitate is washed three times with fresh precipitant and dried in a vacuum oven at 50° C./10 mbar for 72 hours.

b) Blocking of the Hydroxyl Groups 10.0 g of poly-o-hydroxyamide obtained under (a) are dissolved together with 12.3 g of potassium tert-butoxide in 270 ml of tetrahydrofuran (THF) at room temperature with stirring. After 2 hours a solution of 19.2 g of di-tert-butyl dicarbonate in 80 ml of THF is slowly added dropwise to the first solution and the resulting reaction solution is stirred at room temperature for 16 hours. Subsequently the solvent, THF, is stripped off in a rotary evaporator, the solid residue is dissolved in 180 ml of ethyl acetate and the solution is filtered through a folded filter. The solution is subsequently washed with twice 50 ml of 2% strength potassium hydroxide solution, with twice 50 ml of 1% strength aqueous hydrochloric acid and with twice 50 ml of distilled water. The polymer is precipitated by dropwise addition of the ethyl acetate solution to a mixture of isopropanol and water (3:1) and the precipitate is filtered off, washed three times with fresh precipitant and dried in a vacuum oven at 50° C./10 mbar for 72 hours. Thermogravimetric analysis shows that 84% of the hydroxyl groups of poly-o-hydroxyamide is blocked by t-BOC.

c) Formulation, Film Formation, Heat Treatment, and Determination of the Dielectric Constant Formulation and film formation with the copolymers prepared under (a) and (b) take place exactly the same way as described in example 1 (b). The values found for the dielectric constants are as follows:

Heat-treated film from polyhydroxyamide without t-BOC groups: 3.0

Heat-treated film from polyhydroxyamide with t-BOC groups: 2.75

EXAMPLE 5 a) Preparation of the Unprotected Polyhydroxyamide 10.8 g (0.05 mol) of unprotected bisaminophenol II are dissolved in 200 ml of distilled N-methylpyrrolidone (NMP). Added dropwise to this solution at 10° C. with stirring is a solution of 14.8 g (0.05 mol) of diphenyl ether 4,4'-dicarbonyl dichloride in 100 ml of γ-butyrolactone and the reaction solution is stirred at room temperature for 16 hours. Subsequently 9.5 g (0.12 mol) of pyridine in solution in 50 ml of γ-butyrolactone are slowly added dropwise to the reaction solution at room temperature and the reaction solution is stirred at room temperature for a further 2 hours. The resulting polymer is precipitated by adding the reaction solution dropwise to a mixture of isopropanol and water (3:1) and the precipitate is washed three times with fresh precipitant and dried in a vacuum oven at 50° C./10 mbar for 72 hours.

b) Blocking of the Hydroxyl Groups 10.0 g of poly-o-hydroxyamide obtained under (a) are dissolved together with 10.0 g of tetramethylammonium hydroxide in 270 ml of NMP at room temperature with stirring. After 2 hours a solution of 19.2 g of di-tert-butyl dicarbonate in 80 ml of NMP is slowly added dropwise to the first solution and the resulting reaction solution is stirred at room temperature for 16 hours. Subsequently the solvent, NMP, is stripped off in a rotary evaporator, the solid residue is dissolved in 150 ml of ethyl acetate and the solution is filtered through a folded filter. The solution is subsequently washed with twice 50 ml of 2% strength potassium hydroxide solution, with twice 50 ml of 1% strength aqueous hydrochloric acid and with twice 50 ml of distilled water. The polymer is precipitated by dropwise addition of the ethyl acetate solution to a mixture of isopropanol and water (3:1) and the precipitate is filtered off, washed three times with fresh precipitant and dried in a vacuum oven at 50° C./10 mbar for 72 hours.

Thermogravimetric analysis shows that 77% of the hydroxyl groups of poly-o-hydroxyamide are blocked by t-BOC groups.

c) Formulation, Film Formation, Heat Treatment, and Determination of the Dielectric Constant Formulation and film formation with the copolymers obtained under (a) and (b) take place exactly the same way as described in example 1 (b). The values found for the dielectric constants are as follows:

Heat-treated film from polyhydroxyamide without t-BOC groups: 3.1

Heat-treated film from polyhydroxyamide with t-BOC groups: 2.9

EXAMPLE 6

Comparative Example (Comparison with Example 1)

18.3 g (0.05 mol) of bisaminophenol I—unprotected—are dissolved in 250 ml of distilled N-methylpyrrolidone (NMP). Added dropwise to this solution at 10° C. with stirring is a solution of 8.1 g (0.04 mol) of isophthaloyl dichloride in 80 ml of γ-butyrolactone and the reaction solution is stirred at room temperature for 16 hours. Thereafter this solution is admixed dropwise with 3.1 g (0.02 mol) of norbornenecarbonyl chloride in 30 ml of γ-butyrolactone, in order to block the end groups, followed by stirring for 3 hours more. Subsequently 9.5 g (0.12 mol) of pyridine in solution in 50 ml of γ-butyrolactone are slowly added dropwise to the reaction solution at room temperature and the reaction solution is stirred at room temperature for a further 2 hours. The resulting polymer is precipitated by adding the reaction solution dropwise to a mixture of isopropanol and water (3:1) and is isolated by filtration and the precipitate is washed three times with fresh precipitant and dried in a vacuum oven at 50° C./10 mbar for 72 hours.

The dielectric constant of the polymer, determined in accordance with example 1 by the capacitive method, is 2.85.

The dielectric constant is therefore significantly higher than in the case of the corresponding film from example 1 (b) prepared using a poly-o-hydroxyamide with t-BOC groups. The result is all the more surprising on account of the fact that the additional t-BOC groups would have been expected to lead to an increase in the dielectric constant. Although the protective groups are decomposed during heat treatment, the dielectric constant is still lower than that of the unprotected comparative polymer.

Although the invention is described herein as embodied in formulations, preparation processes, and specific applications, in particular as polybenzoxazoles from poly-o-hydroxyamide, novel poly-o-hydroxyamides, preparation processes therefor, and their application in microelectronics, it is nevertheless not intended to be limited to the exemplary details that are specifically described. Various modifications and structural changes may be made therein without departing from the spirit of the invention and within the scope and range of equivalents of the claims.

What is claimed is:

1. A poly-o-hydroxyamide, comprising:
   hydroxyl groups; and
   tert-butoxycarbonyl groups protecting at least some of said hydroxyl groups, said tert-butoxycarbonyl groups having the formula formula I

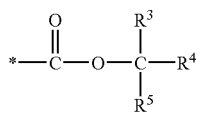

wherein the radicals $R^3$, $R^4$, and $R^5$ are selected from the group consisting of —H, —F, —$(CH_2)_n$—$CH_3$, —$(CF_2)_n$—$CF_3$, where n=0 to 10, and with a proviso that at least one of the radicals $R^3$, $R^4$, and $R^5$ is different from hydrogen.

2. The poly-o-hydroxyamide according to claim 1, corresponding to the general formula formula II

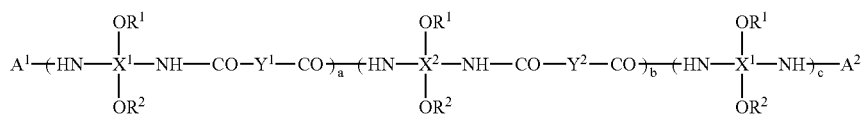

wherein $R^1$ and $R^2$ are or are not hydrogen or a tert-butoxycarbonyl group of the general formula I, and wherein at least one of $R^1$ or $R^2$ is formed at least in part by —COOC($R^3R^4R^5$);

$A^1$ and $A^2$ (attached to —NH—) are identical or different and are selected from the group consisting of —H; —CO—$(CH_2)_n$—$CH_3$; —CO—$(CF_2)_n$—$CF_3$; —CO—CH=CH—COOH; where n=0 to 10;

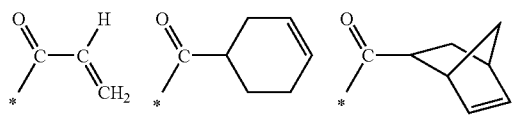

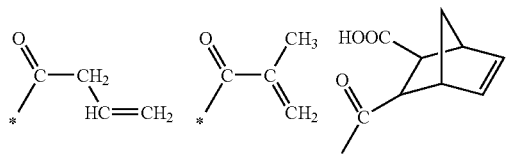

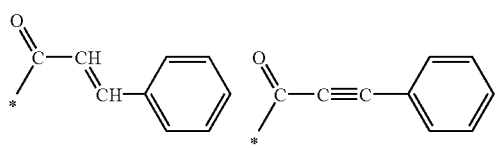

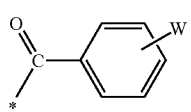

wherein W is selected from the group consisting of W=—H, —F, —CN, —C($CH_3$)$_3$, —$(CH_2)_n$—$CH_3$, —$(CF_2)_n$—$CF_3$, —O—$(CH_2)_n$—$CH_3$, —O—$(CF_2)_n$—$CF_3$; —CH=$CH_2$, —C≡CH and

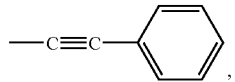

where n=0 to 10;

wherein $A^2$ is an OH group if at least one of the following is true: $A^2$ is attached to —CO—, and c=0;

$X^1$ and $X^2$, independently of one another, are:

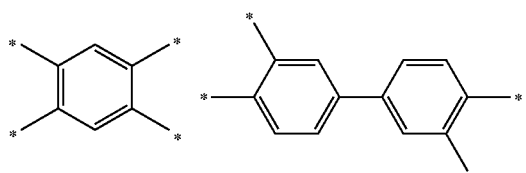

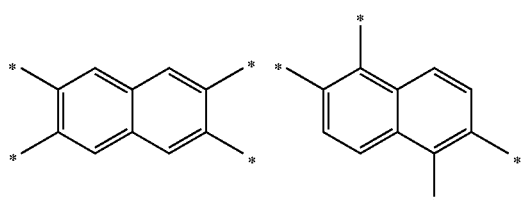

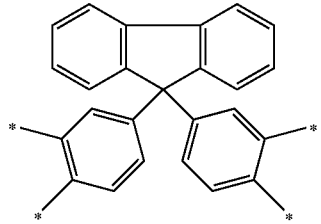

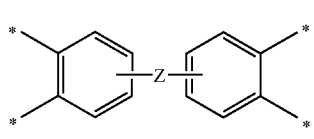

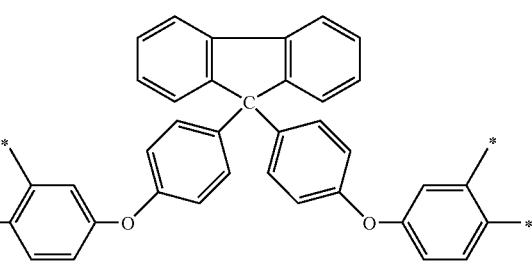

Z is selected from the group consisting of —O—; —CO—; —S—; —S—S—; —SO$_2$—; —(CH$_2$)$_m$—; —(CF$_2$)$_m$— where m=1 to 10; —C(CR$^6_3$)$_2$— where R$^6$ is identical or different and can be a hydrocarbon radical with 1 to 2 carbon atoms and may also be fully or partly fluorinated, hydrogen, halide or pseudohalide;

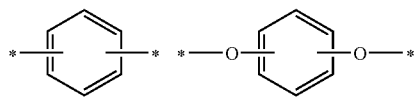

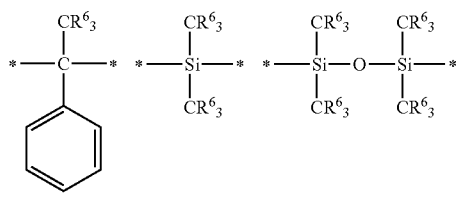

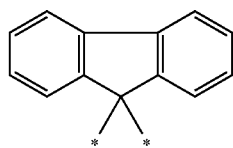

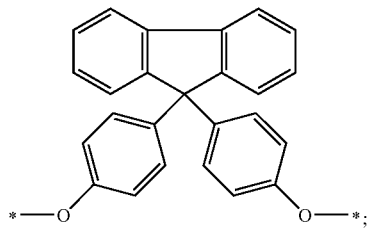

Y$^1$ and Y$^2$, independently of one another, are:

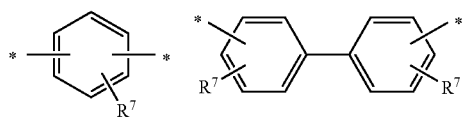

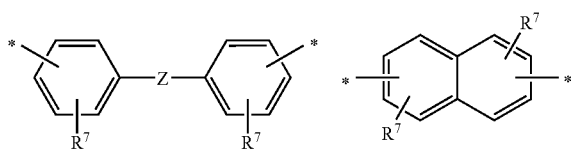

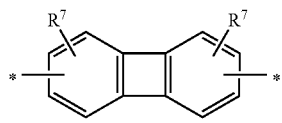

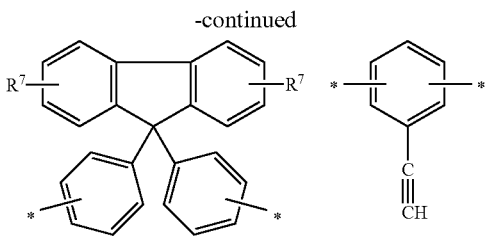

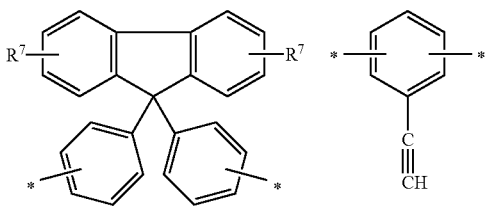

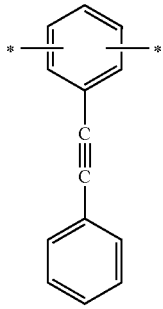

wherein R$^7$ is selected from the group consisting of —H, —CN; —C(CH$_3$)$_3$; —C(CF$_3$)$_3$; —(CH$_2$)$_n$—CH$_3$; —(CF$_2$)$_n$—CF$_3$; —O—(CH$_2$)$_n$—CH$_3$, —O—(CF$_2$)$_2$—CF$_3$, —C≡CH; —CH═CH$_2$; —O—CH═CH$_2$; —O—CH$_2$—CH═CH$_2$; —CO—(CH$_2$)$_n$—CH$_3$; and —CO—(CF$_2$)$_n$—CF$_3$, where n=0 to 10;

and Z is as defined above; and wherein a may adopt any value from 1 to 100; b may adopt any value from 0 to 100; and c may adopt the value 0 or 1.

3. A method of producing polybenzoxazole, which comprises providing a poly-o-hydroxyamide according to claim 1, and heat-treating the poly-o-hydroxyamide to obtain the polybenzoxazole.

4. A method of preparing a poly-o-hydroxyamide, which comprises the following steps:

providing bisaminophenol having at least one protected hydroxyl group, the hydroxyl function being protected by a tert-butoxycarbonyl group defined by the formula

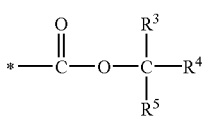

wherein the radicals R$^3$, R$^4$, and R$^5$ are selected from the group consisting of —H, —F, —(CH$_2$)$_n$—CH$_3$, —(CF$_2$)$_n$—CF$_3$, where n=0 to 10, and with a proviso that at least one of the radicals R$^3$, R$^4$, and R$^5$ is different from hydrogen; and reacting the bisaminophenol having the protected hydroxyl group with at least one activated dicarboxylic acid.

5. A process for preparing a poly-o-hydroxyamide, which comprises reacting a poly-o-hydroxyamide of the formula

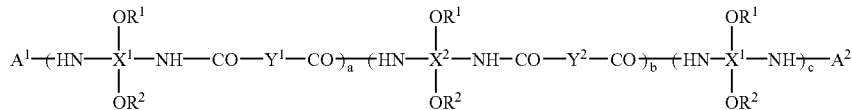

having unprotected hydroxyl groups, where $R^1=R^2=$—H, with di-tert-butyl dicarbonate.

6. An improved coating method, which comprises providing a poly-o-hydroxyamide according to claim 1 and forming a coating layer with the poly-o-hydroxyamide.

7. The method according to claim 6, which comprises heat-treating the poly-o-hydroxyamide to form a coating of polybenzoxazole.

8. The method according to claim 7, wherein the polybenzoxazole is formed with a dielectric constant of less than 3.0.

9. The method according to claim 6, which comprises forming a coating on a microelectronic device.

10. A photosensitive formulation, comprising the poly-o-hydroxyamide according to claim 1.

11. The photosensitive formulation according to claim 10, which further comprises a photoacid generator.

12. A photosensitive formulation, comprising the polybenzoxazole according to claim 3.

13. The photosensitive formulation according to claim 12, which further comprises a photoacid generator.

14. A photosensitive formulation for a microelectronics production process, comprising the poly-o-hydroxyamide according to claim 1.

15. The photosensitive formulation according to claim 14, which further comprises a photoacid generator.

16. A photosensitive formulation for a microelectronics production process, comprising the polybenzoxazole formed by the method of claim 3.

17. The photosensitive formulation according to claim 16, which further comprises a photoacid generator.

18. The poly-o-hydroxyamide according to claim 1, wherein the proportion of the hydroxyl groups blocked by a t-butoxycarbonyl group of the formula I relative to the number of free hydroxyl groups in the unprotected poly-o-hydroxyamide is at least 30%.

\* \* \* \* \*